US008049213B2

(12) United States Patent
Su et al.

(10) Patent No.: US 8,049,213 B2
(45) Date of Patent: Nov. 1, 2011

(54) FEATURE DIMENSION MEASUREMENT

(75) Inventors: Ching-Chung Su, Yongkang (TW); Yi-Wei Chiu, Kaohsiung (TW); Tzu Chan Weng, Kaohsiung (TW); Yih Song Chiu, Hsin-Chu (TW); Pin Chia Su, Tainan County (TW); Chih-Cherng Jeng, Hsin-Chu (TW); Kuo-Hsiu Wei, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 832 days.

(21) Appl. No.: 11/958,942

(22) Filed: Dec. 18, 2007

(65) Prior Publication Data

US 2009/0152545 A1    Jun. 18, 2009

(51) Int. Cl.
*H01L 21/66* (2006.01)
*H01L 23/544* (2006.01)
(52) U.S. Cl. ............. 257/48; 257/E21.53; 257/E23.179; 356/401; 356/603
(58) Field of Classification Search .................. 356/401, 356/603, 496; 257/48, E21.53, E23.179
See application file for complete search history.

(56) References Cited

U.S. PATENT DOCUMENTS

| | | | | |
|---|---|---|---|---|
| 5,361,137 A * | 11/1994 | Aton et al. | ................... | 356/496 |
| 6,423,977 B1 * | 7/2002 | Hayasaki et al. | ........ | 250/559.19 |
| 6,525,829 B1 | 2/2003 | Powell et al. | | |
| 6,819,426 B2 * | 11/2004 | Sezginer et al. | ............. | 356/401 |
| 2005/0146729 A1 * | 7/2005 | Scheiner et al. | ............. | 356/504 |
| 2008/0131796 A1 * | 6/2008 | Werner et al. | ................... | 430/30 |

OTHER PUBLICATIONS

Barnat, E.V. et al., "Real Time Resistivity Measurements During Sputter Deposition of Ultrathin Copper Films," Journal of Applied Physics, Feb. 1, 2002, pp. 1667-1672, vol. 91, No. 3.
Chen, Fen, et al., "Influence of Line Dimensions on the Resistance of Cu Interconnections," IEEE Electron Device Letters, Dec. 1998, pp. 508-510, vol. 9, No. 12.
Crozier, K. B. et al., "Thin Film Characterization by Atomic Force Microscopy at Ultrasonic Frequencies," American Institute of Physics, Apr. 3, 2000, pp. 1950-1952, Applied Physics Letters vol. 76, No. 14.
Jiang, Qing-Tang, et al., "Line Width Dependence of Copper Resistivity," IEEE, 2001, 3 pages.
Kapur, Pawan, et al., "Realistic Copper Interconnect Performance with Technological Constraints," IEEE, 2001, pp. 233-235.
Kim, Choong-Un, "Extendibility of Cu Interconnects at the Nanoscale: Initial Assessment," Materials Science and Engineering the University of Texas at Arlington, 27 pages.

(Continued)

*Primary Examiner* — Colleen Matthews
(74) *Attorney, Agent, or Firm* — Haynes and Boone, LLP

(57) ABSTRACT

A method of measuring dimensional characteristics includes providing a substrate and forming a reflective layer over the substrate. A dielectric layer is then formed over the reflective layer. The dielectric layer includes a grating pattern and a resistivity test line inset in a transparent region. Radiation is then directed onto the dielectric layer so that some of the radiation is transmitted through the transparent region to the reflective layer. A radiation pattern is then detected from the radiation reflected and scattered by the metal grating pattern. The radiation pattern is analyzed to determine a first dimensional information. Then the resistance of the resistivity test line is measured, and that resistance is analyzed to determine a second dimensional information. The first and second dimensional informations are then compared.

9 Claims, 3 Drawing Sheets

OTHER PUBLICATIONS

Knight, Gary D. et al., "Modelling Roughness, Grain and Confinement Effects on Transport in Embedded Metallic Films," Elsevier Science B.V., 2002, pp. 417-428, Microelectronic Engineering 64.

Ravid, Avi et al., "Copper CMP Planarity Control Using ITM", Advanced Semiconductor Conference and Workshop, 2000 IEEE/SEMI, pp. 437-443.

Rossnagel, S.M. et al., "Alteration of Cu Conductivity in the Size Effect Regime," American Vacuum Society, Jan./Feb. 2004, pp. 240-247, J. Vac. Sci. Technol. B 22(1).

"NovaScan 3090: Delivering Advanced Process Control for High-End Applications Using Polarized DUV", printed from Nova website www.nova.co.il, 4 pages, date unknown.

* cited by examiner

US 8,049,213 B2

FEATURE DIMENSION MEASUREMENT

BACKGROUND

Semiconductor devices continue to get smaller as manufacturers find new ways to reduce feature dimensions. Measurements taken during production may be used for process control. As a result, even small errors in feature dimension measurement can negatively affect production yields.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

DETAILED DESCRIPTION

The present disclosure relates generally to feature dimension measurement, and more specifically to the measurement of feature dimensions in semiconductor devices. It is understood, however, that the following disclosure provides many different embodiments, or examples, for implementing different features of the invention. Specific examples of components and arrangements are described below to simplify the present disclosure. These are, of course, merely examples and are not intended to be limiting. Furthermore, the subject matter of this application may be useful in technologies other than semiconductor manufacturing.

Figure 1:
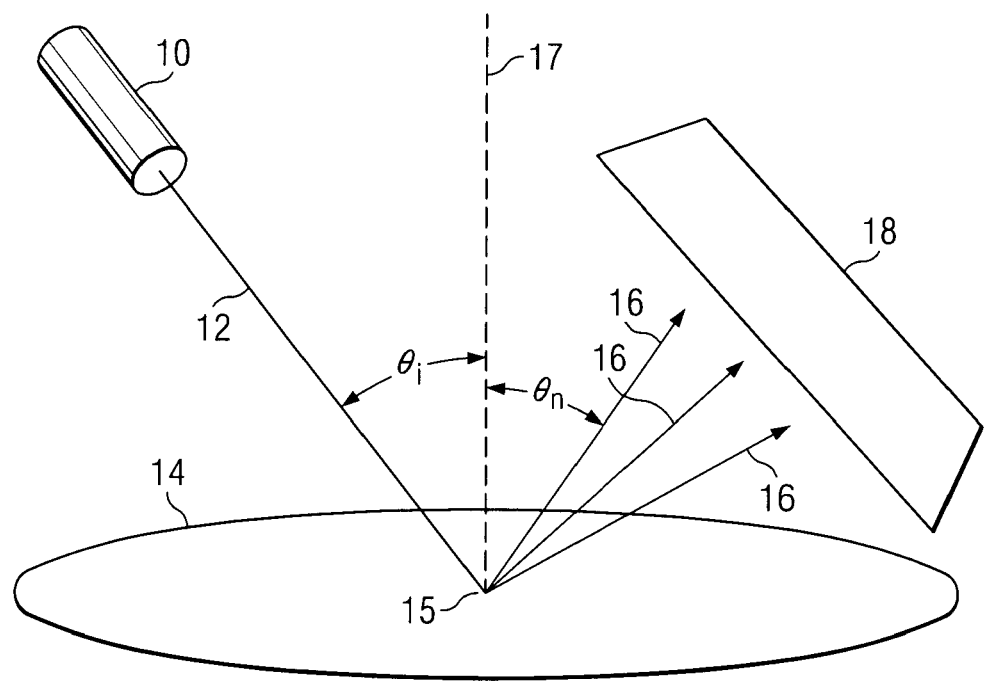
FIG. 1 illustrates a device for performing scatterometry analysis.

Referring to FIG. 1, illustrated is a device for performing scatterometry analysis. A radiation source 10 directs radiation 12 onto a substrate 14. The radiation 12 may be electromagnetic radiation, such as light having a wavelength in the visible or near-visible spectrum. In some embodiments, the radiation 12 may be a coherent energy beam having a single wavelength, which may be provided by a device such as a laser. For example, a HeNe laser may be employed to provide coherent light with a wavelength of 633 nm. Other radiation sources may also be used, such as an excimer, nitrogen TEA, metal ion, or other suitable laser. In some embodiments, the radiation 12 may be an ultraviolet or deep ultraviolet laser beam.

The radiation 12 falls on the substrate 14 at an incident location 15 and at an incident angle $\theta_i$ measured from an orthogonal line 17 relative to the surface of substrate 14. The radiation may be reflected, refracted, absorbed, diffracted, or scattered depending on the physical characteristics of the substrate 14. The relevant physical characteristics may include the chemical composition of the substrate 14 and the dimensions of any features in or on the substrate 14. For instance, the radiation 12 may fall on a periodic structure (not shown) in or on the substrate 14, as will be discussed later with reference to FIG. 2, and the periodic structure may cause the radiation 12 to scatter, producing scattered radiation 16. A detector 18 may detect the scattered radiation 16 and may provide information about the intensity, wavelength, polarization, or other information about the scattered radiation 16 as a function of scatter angle $\theta_n$. This information about the scattered radiation 16 measured as a function of scatter angle $\theta_n$ may form a scatter signature that relates to the physical characteristics of the substrate 14 at the incident location 15. Information about the physical characteristics of the substrate 14 at the incident location 15 can be determined by analyzing the scatter signature. In some embodiments, the scatter signature may include measurements of the scattered radiation 16 observed at multiple radiation wavelengths or incident angles or both.

Any suitable mechanism may be used to relate the scatter signature back to the physical characteristics of the substrate 14 at the incident location 15. For instance, the scatter signature may be compared to a library of scatter signatures using a best-fit model. The library scatter signature that most closely resembles the measured scatter signature may be taken as a match, and the physical characteristics of the substrate 14 at the incident location 15 may be determined to be the physical characteristics associated with the library scatter signature. In this way, the physical characteristics for an unknown—here, the substrate 14 at the incident location 15—may be determined from one or more scatterometry measurements.

The library of scatter signatures used for comparing against measured scatter signatures may be derived empirically or analytically. For instance, a scatter signature may be experimentally recorded for a plurality of samples whose dimensions are known. Scatter signatures may also be computed for a range of dimensions using rigorous coupled-wave theory, grating parameterization, or other suitable methods of calculating electromagnetic field diffracted by a grating pattern. Exemplary methods for calculating scatter signatures are described "Scatterometry for Semiconductor Metrology" by Christopher J. Raymond, reprinted in Handbook of Silicon Semiconductor Metrology, Alain C. Diebold ed., ISBN 0-8247-0506-8, which is hereby incorporated by reference.

In some embodiments, the analysis of a scatter signature may dispense with the library of scatter signatures and rely instead on a regressive iteration over a mathematical model of the electromagnetic field diffracted by the grating pattern. In still other embodiments, analysis using a library may be used to provide a starting point for a subsequent regression analysis.

Figure 2:
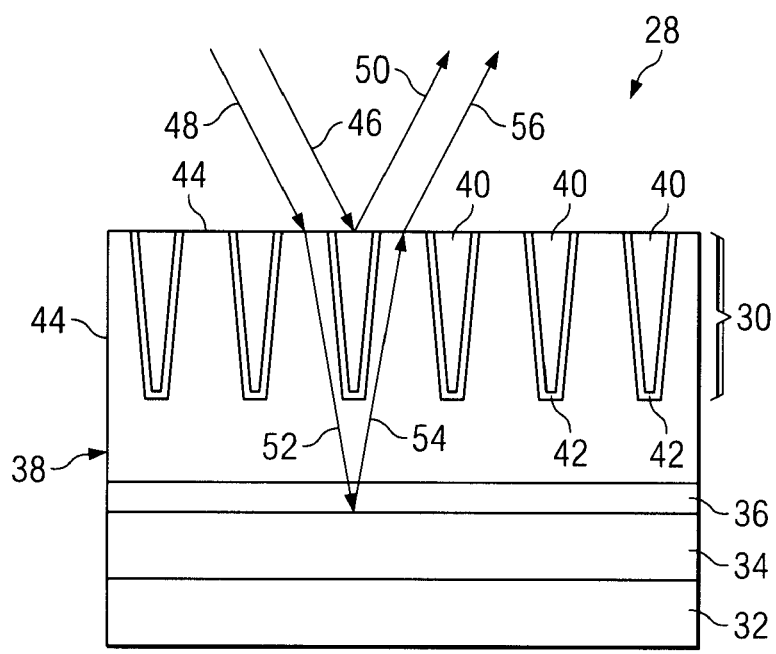
FIG. 2 illustrates a cross-sectional view of a scatterometry test structure.

FIG. 2 illustrates a cross-sectional view of a scatterometry test structure 28, which includes a diffraction grating pattern 30 formed over a substrate 32. The substrate 32 may comprise silicon, silicon-on-insulator (SOI), silicon with defective crystalline, and/or diamond or other suitable materials. In some embodiments, the substrate 32 may comprise one or more gate or metallization layers, and it may include one or more layers of fabricated or partially fabricated semiconductor devices. Formed over the substrate 32 is a reflective metal layer 34, which in some embodiments may be copper. The reflective metal layer 34 may have a substantially uniform upper surface for uniformly reflecting incident light rays. Although the reflective metal layer 34 is illustrated in FIG. 2 as being a contiguous plate, in some embodiments the reflective metal layer 34 may comprise multiple discontiguous sections. For example, the reflective metal layer 34 may be a poster array. Dividing the reflective metal layer 34 into multiple discontiguous sections may reduce the stress or strain induced at the boundaries between reflective metal layer 34 and adjacent layers, such as the substrate 32. In still other embodiments, the reflective metal layer 34 may be a metallization interconnect layer that may include metal interconnects that electrically couple semiconductor devices or structures formed in the substrate 32. In yet other embodiments, the reflective metal layer 34 may be absent.

Formed over the reflective metal layer 34 is an insulating layer 36. The insulating layer 36 may comprise a variety of different materials, including but not limited to doped or undoped $SiO_2$, SiC, CN, SiOC, and carbon-doped silicon oxide. The insulating layer 36 may be optically transparent, and it may have a thickness between about 1000 Å and 100000 Å. In some embodiments, the insulating layer 36 may be absent, or it may be composed of one or more sub-layers. For example, the insulating layer 36 includes two sublayers, a lower layer of a first dielectric material proximate the reflective metal layer 34 and an upper layer of a second dielectric material. For instance, the lower layer may be a layer of BLACK DIAMOND™ by Applied Materials that is about 550 Å thick, and the upper layer may be a 300 Å layer of silicon oxide formed by the chemical vapor deposition of TEOS. The insulating layers may comprise any suitable material and may be formed using any appropriate process.

Disposed over the insulating layer 36 is a grating layer 38, which may comprise a dielectric material 44 such as $SiO_2$, SiC, CN, SiOC, or other suitable dielectric. The dielectric material 44 may be transparent. In one embodiment, the grating layer comprises BLACK DIAMOND™ by Applied Materials. In the grating layer 38 are trenches 40 that form a periodic grating pattern. The trenches 40 may each be substantially similar in height, width, and length, and they may be spaced substantially equally apart. The ratio of the width of the trenches 40 to the width of the dielectric material 44 may have a value between about 0.5 and 2.0. The trenches may be voids, or they may be filled with a material that may be reflective or opaque, for instance a metal, such as copper or aluminum, or any other suitable material. In some embodiments, the trenches 40 may be 1000 Å-6000 Å deep. At a boundary between a trench 40 and the dielectric material 44 may be a barrier layer 42, which may be any suitable barrier material, and in some embodiments may be tantalum.

The grating layer 38 is formed using any appropriate process. In some embodiments, the trenches 40 are formed as part of a dual-damascene process, and the trenches 40 are subsequently filled using an electroplating process.

FIG. 2 further illustrates the reflection and refraction of two radiation rays incident on the grating pattern 30. Incident radiation in the form of light rays 46 and 48 falls on distinct parts of the grating pattern 30. Light ray 46 strikes a trench 40 that, in the illustrated embodiment, is reflective and produces a reflected light ray 50. Light ray 48 strikes the dielectric material 44 and refracts into light ray 52 that passes through transparent dielectric material 44 and insulating layer 36 and reflects at reflective metal layer 34. The reflected ray 54 passed through insulating layer 36 and transparent dielectric material 44, then refracts as it leaves the transparent dielectric material 44 as light ray 56.

In addition to the reflection and refraction of radiation shown in FIG. 2, the incident light rays may be scattered by non-uniformities in the scatterometry test structure 28, such as the grating pattern 30. As a result of the reflection, refraction, and scattering of light rays incident on the test area 28, the light rays emanating from the scatterometry test structure 28 have characteristics that depend on the structure and composition of the test area, such as the depth, width and sidewall angle of the trenches 40, the depth of insulating layer 36 and the depth of grating layer 38. The light rays emanating from a particular scatterometry test structure 28 will constitute a scatter signature that may be analyzed to determine the structural characteristics of the grating pattern 30. The scatter signature from the scatterometry test structure 28 can then be compared to a library of scatter signatures to determine characteristics of the scatterometry test structure 28. For example, analysis of the scatter signature may provide information such as the depth of trenches 40, the width of trenches 40, the sidewall angle of trenches 40, the depth of grating layer 38, and the depth of insulating layer 36. This analysis may be done by measured scatter signature to the entries library of scatter signatures using a best-fit approach to determine which entry in the library most closely resembles the measured scatter signature. Once the best fit is determined, the dimensional characteristics associated with that library entry may be taken to be the dimensional characteristics of the measured sample.

In some instances, the measured scatter signature may differ from the library entry that it most closely resembles. In other words, the measured scatter signature may not match a library entry exactly. This may be measured by a "goodness of fit" that measures the error in matching a measured scatter signature to the best-fit library entry. One way that a poor fit may occur is that the true dimensional characteristics of the measured substrate lie between two or more library entries. For example, if two library entries have a certain feature size of 1500 Å and 1550 Å, respectively, then a substrate having an actual true size of 1535 Å will not exactly match either library entry, and it may have a low goodness-of-fit value. The goodness-of-fit may be improved by refining the library to have more entries with smaller variations between their dimensional characteristics. For example, the library with two entries having a certain feature size of 1500 Å and 1550 Å—indicating a step size of 50 Å—may be revised to have a step size of 10 Å, 5 Å, 1 Å, or another appropriate value.

A measured scatter signature may have a poor goodness-of-fit value even when compared to a large library of scatter signatures having small step sizes for each dimensional characteristic. A poor goodness-of-fit value in such a situation may indicate that the measured substrate has a dimensional variation that is not captured by the variables used to generate the library. For instance, a library may be generated by varying the depth, width, and pitch of a trench pattern. The generated library would take the sidewalls of the trenches to be vertical. If a scatter signature from a substrate having angled sidewalls were compared to the generated library, the goodness-of-fit value may be low. In this instance, a low goodness-of-fit value may indicate that a more comprehensive library may be needed to account for more structural variations, such as sidewall angle. Where the library already accounts for variations in many dimensional characteristics, a low goodness-of-fit value may indicate that the substrate has a malformed or deformed structure. For instance, metal pits, erosion, and dishing may cause a low goodness-of-fit value.

The structural characteristics of the grating pattern 30, and in particular the depth and width of the trenches 40, may be useful for calculating the resistivity of a metal filling the trenches 40, for instance copper. For copper lines having dimensions near the electron mean-free path length, the resistivity has been shown to correlate strongly with the line dimension. This has been shown in: "Influence of Line Dimensions on the Resistance of Cu Interconnections" by Chen and Gardner, IEEE Electron Device Letters, Vol. 19, No. 12 (December 1998); and "Alternation of Cu conductivity in the size effect regime" by Rossnagel and Kuan, J. Vac. Sci. Technol. (January/February 2004), which are hereby incorporated by reference. Thus, the dimensions determined by the disclosed technique of measuring light scattering may be used to calculate the resistivity of a metal interconnect.

It will be appreciated by those skilled in the art that some embodiments of the disclosed measurement technique may call for structures in the semiconductor that are fabricated on two proximate metallization layers. For instance, the reflective metal layer 34 may be formed in a first metallization layer and the grating layer 38 may be formed in a second metallization layer. This multi-layer approach will now be discussed with reference to FIG. 3.

Figure 3:
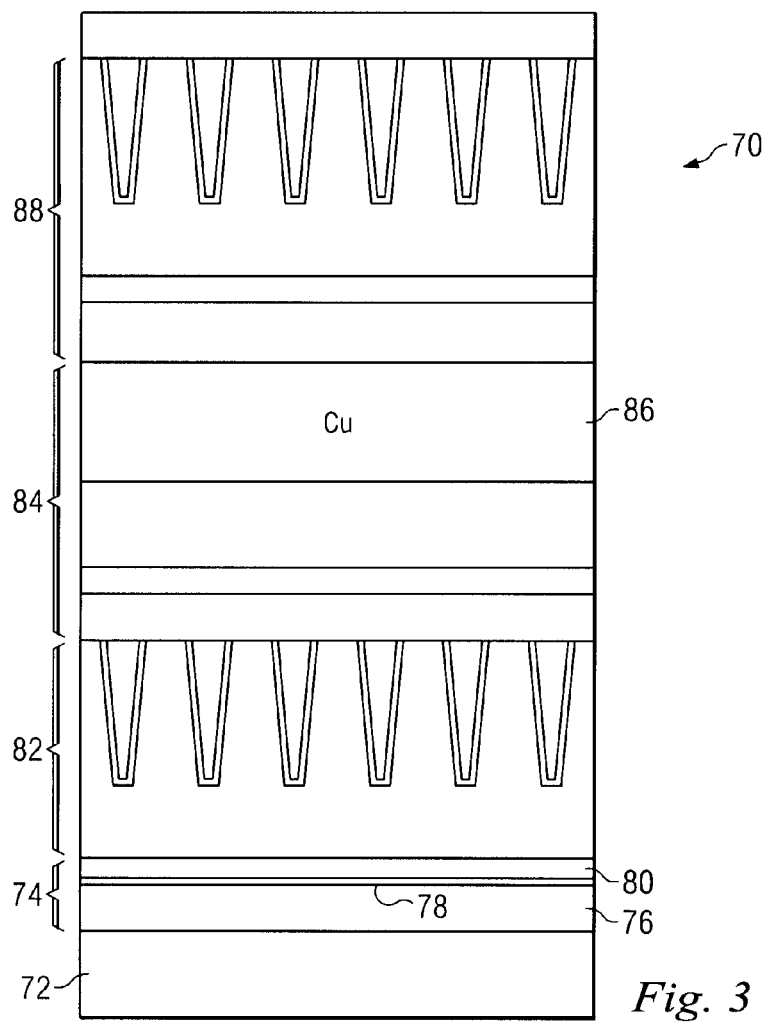
FIG. 3 illustrates a cross-sectional view of multiple metallization levels formed in a substrate.

Referring now to FIG. 3, illustrated is a cross-sectional view of three metallization layers of a partially fabricated semiconductor 70. The partially fabricated semiconductor 70 includes a substrate 72, over which is formed a first metallization layer 74. The first metallization layer 74 includes a metal layer 76 and dielectric layers 78 and 80. Over the first metallization layer 74 is a second metallization layer 82 that may include an embedded grating structure. During the fabrication of the partially fabricated semiconductor 70 after forming the second metallization layer 82, the grating structure in the second metallization layer 82 could be used in conjunction with the metal layer 76 to perform scattering measurements. For instance, the measurements might be used to measure the thickness of the second metallization layer 82, the depth of the grating structure, or both. Measurements of the depth of the grating structure may be used, for instance, for controlling a chemical mechanical polishing step applied to the upper surface of the second metallization layer 82.

As shown in FIG. 3, there is formed over the second metallization layer 82 a third metallization layer 84. The third metallization layer 84 includes a metal layer 86.

Formed over the third metallization layer 84 is a fourth metallization layer 88 that includes a grating structure. The metal layer 86 of the third metallization layer 84 may act as a reflective layer when performing scattering measurements using the grating structure in the fourth metallization layer 88. As can be appreciated from FIG. 3, in some embodiments the semiconductor structures used for scattering measurements may be on two proximate metallization layers. A reflective plate may be on layer n, while a grating pattern may be on layer n+1. More generally, in a semiconductor product that comprises a plurality of metallization layers, a location on the semiconductor wafer may include grating pattern and a reflective layer on alternating metallization layers. These alternating layers may be sited on an unused portion of the semiconductor die, and they may also be on a cut line. There may be multiple test sites on the semiconductor wafer, and they be arranged such that at least one grating pattern is available for testing each metallization layer. Multiple test sites may also be used to produce a profile of dimensional information across the surface of the wafer. The profile of dimensional information may provide data useful for monitoring or controlling a semiconductor fabrication process, such as electroplating or chemical mechanical polishing.

Multi-Test Sites

Figure 4:
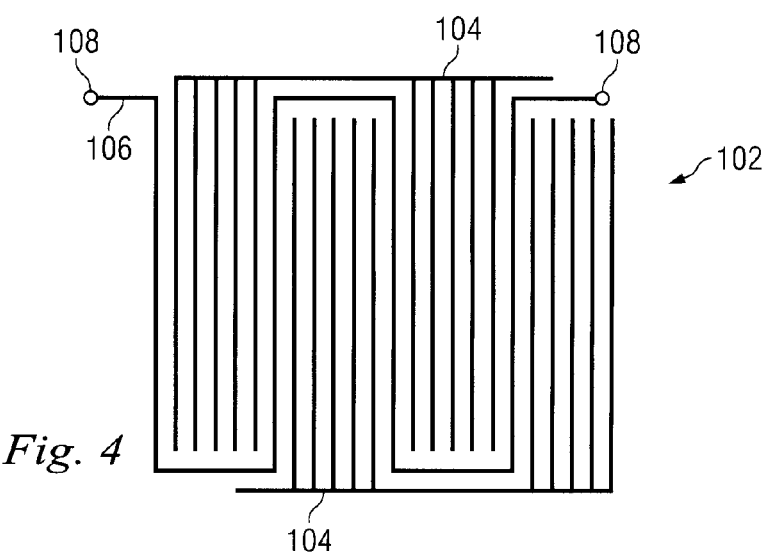
FIG. 4 illustrates a top view of a dual-purpose diffraction grating pattern.

For copper line widths less than about 0.5 µm, the resistivity may be strongly dependent on the line dimensions. Thus electrical measurements of line resistance may be used to indirectly measure the dimensions of thin copper lines. FIG. 4 shows a test structure 102 that may be used to measure line dimensions using two different techniques. The test structure 102 includes grating lines 104 and further includes a resistivity test line 106 between endpoints 108. The resistivity test line 106 is integrated with and forms a portion of a grating structure in combination with the grating lines 104. Thus the test structure 102 may be used to measure the dimensions of grating lines 104 and resistivity test line 106 using the scatter measurement technique disclosed herein, and the resistivity test line 106 may be used to measure the line dimensions using an electrical resistance measurement tool. Because both measurements are taken at a single wafer substrate site, it is possible to minimize or eliminate variances due to surface variations. The two measurements of line dimensions may be compared to confirm their reliability. If the two measurements agree, then the line dimension information may be more confidently relied upon in making process control decisions, for instance in determining the endpoint of a chemical-mechanical polishing process. If the measurements differ by more than a threshold amount, an investigation may be made to determine the source of the discrepancy.

A scatterometry measurement of line dimensions may be made at various sites across a wafer surface, thereby providing a profile of the wafer surface to be developed. In some embodiments, all of the scatterometry measurement sites may also be tested using the electrical resistance test method, thus providing a mechanism to confirm the reliability of the measurements at each site. In some other embodiments, the scatterometry measurement may be verified by using the electrical resistance test method at substantially less than all of the sites. A limited-verification approach may be used, for instance, to reduce the time spent making measurements.

Figure 5:
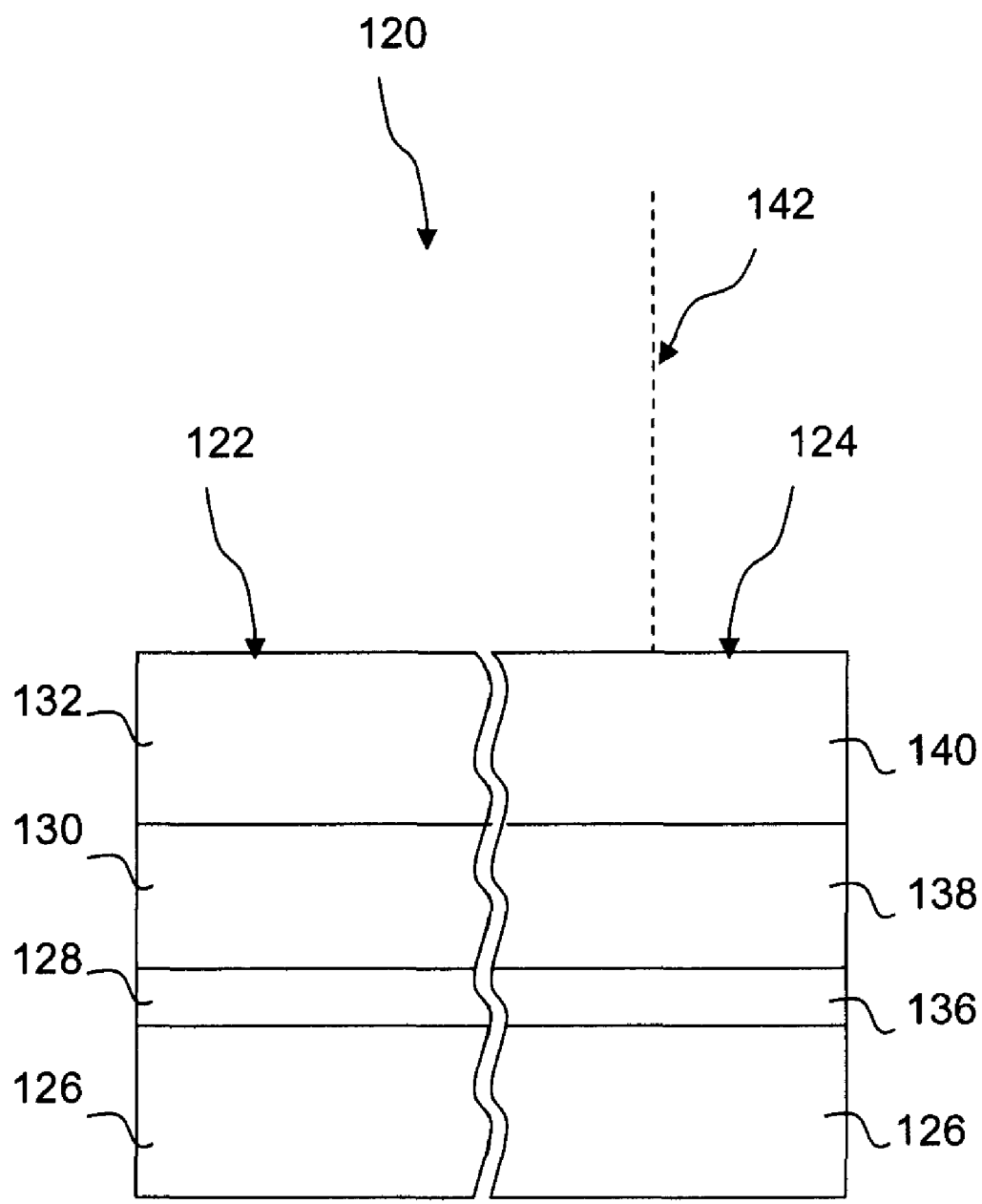
FIG. 5 illustrates a cross-sectional block diagram of a semiconductor device, according to some embodiments.

FIG. 5 illustrates a cross-sectional block diagram of a semiconductor device 120, according to some embodiments. Notably, as FIG. 5 illustrates a cross-sectional block diagram of the semiconductor device 120, the features are not drawn to scale and are used for illustration purposes only. Referring to FIG. 5, the semiconductor device 120 includes a device area 122 and a test area 124, wherein the device area 122 and the test area 124 are formed over a substrate 126. The substrate 126 may include a plurality of semiconductor dies which are separated by cut line(s) 142. The device area 122 may include a gate layer 128 formed over the substrate 126, wherein the gate layer 128 includes at least one gate. Over the gate layer 128 a interlayer dielectric layer 130 may be formed. In some embodiments, the interlayer dielectric layer 130 may include a plurality of vias, as is well known in the art. Formed over the interlayer dielectric layer 130 is a damascene layer 132, wherein the damascene layer 132 includes at least one interconnection. In some embodiments, the damascene layer 132 includes a plurality of copper lines coupled to the plurality of vias in the interlayer dielectric layer 130.

The test area 124 includes a reflective layer 136 formed over the substrate 126. Over the reflective layer 136 a transparent layer 138 is formed. In some embodiments the transparent layer 138 may have a thickness substantially equal to the thickness of the interlayer dielectric layer 130. Formed over the transparent layer 138 a grating pattern layer 140 is formed. In some embodiments, the grating layer 140 may have a thickness substantially equal to the thickness of the damascene layer 132 and may include a gating pattern (see FIG. 2) comprising a plurality of dielectric regions (see FIG. 2), a plurality of grating lines (see FIG. 4) and a resistivity test line (see FIG. 4). In some embodiments, the width of each of the plurality of grating lines may be equal to a width of the resistivity test line. In other embodiments, the test area 124 may be located along a cut line 142 of the substrate 126. In other embodiments, the test area 124 may also be located in a nonfunctional portion of a die in the substrate 126.

In summary, a method for measuring feature dimensions is disclosed. The method includes providing a substrate and forming a reflective layer over the substrate. A dielectric layer is then formed over the reflective layer. The dielectric layer includes a metal grating pattern inset in a transparent region, where the metal grating pattern includes metal-filled trenches at regular intervals. The method then continues with directing radiation onto the dielectric layer, and some of the radiation transmits through the transparent region to the reflective layer. A radiation pattern is then detected and analyzed to determine a dimension of the dielectric layer, for instance, the depth of the metal-filled trenches. In some embodiments, the method also includes forming a resistivity test line inset in the metal grating pattern. The resistance of the resistivity test line is measured and analyzed to determine a dimension of the dielectric layer. The dimension determined from the radiation pattern is then compared to the dimension determined from the resistivity test line.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A semiconductor device comprising:
    a substrate;
    a device area comprising:
        a gate layer formed over the substrate and including at least one gate;
        an interlayer dielectric layer formed over the gate layer; and
        a damascene layer formed over the interlayer dielectric layer and including at least one interconnection;
    a test area comprising:
        a reflective layer formed over the substrate;
        a transparent layer formed over the reflective layer and having a thickness substantially equal to the thickness of the interlayer dielectric layer; and
        a grating pattern layer formed over the transparent layer, having a thickness substantially equal to the thickness of the damascene layer, and comprising a grating pattern comprising a plurality of dielectric regions, a plurality of grating lines and a resistivity test line.

2. The device of claim 1 wherein the grating pattern comprises copper.

3. The device of claim 1 wherein a width of each of the plurality of grating lines is equal to a width of the resistivity test line.

4. The device of claim 3 wherein each of the plurality of dielectric regions has a width that is substantially equal to the width of each of the plurality of grating lines.

5. The device of claim 1 wherein the test area is located along a cut line of the substrate.

6. The device of claim 1 wherein the test area is located in a nonfunctional portion of a die in the substrate.

7. The device of claim 1 wherein the interlayer dielectric layer and the transparent layer have a substantially same composition.

8. The device of claim 7 wherein the substantially same composition comprises a low-k dielectric.

9. A semiconductor device comprising:
    a substrate comprising a plurality of semiconductor dies separated by cut lines;
    a device region comprising:
        a gate layer formed over the substrate and including a plurality of gates;
        an interlayer dielectric layer formed over the gate layer and comprising a plurality of vias; and
        a damascene layer formed over the interlayer dielectric layer and comprising a plurality of copper lines coupled to the plurality of vias in the interlayer dielectric layer;
    a test region formed at a cut-line of the substrate comprising:
        a reflective layer formed over the substrate;
        a transparent layer formed over the reflective layer and having a thickness substantially equal to the thickness of the interlayer dielectric layer; and
        a grating pattern layer formed over the transparent layer, having a thickness substantially equal to the thickness of the damascene layer, and comprising a grating pattern comprising a plurality of dielectric regions, a plurality of grating lines and a resistivity test line.

* * * * *